(12) United States Patent
Dreher et al.

(10) Patent No.: US 6,640,125 B2
(45) Date of Patent: Oct. 28, 2003

(54) SPECTROSCOPIC IMAGING METHOD

(75) Inventors: Wolfgang Dreher, Bremen (DE); Dieter Leibfritz, Rottenburg (DE)

(73) Assignee: Siemens Aktiengesellschaft, Münich (DE)

( * ) Notice: Subject to any disclaimer, the term of this patent is extended or adjusted under 35 U.S.C. 154(b) by 381 days.

(21) Appl. No.: 09/819,431

(22) Filed: Mar. 28, 2001

(65) Prior Publication Data
US 2002/0008515 A1 Jan. 24, 2002

(30) Foreign Application Priority Data
Mar. 28, 2000 (DE) ......................................... 100 15 265

(51) Int. Cl.$^7$ ................................................. A61B 5/05
(52) U.S. Cl. ........................................................ 600/410
(58) Field of Search ................................. 600/410, 407, 600/413, 416, 417, 436; 324/307, 308, 309

(56) References Cited

U.S. PATENT DOCUMENTS

| 4,327,425 A | | 4/1982 | Ernst et al. | |
| 4,628,262 A | | 12/1986 | Maudsley | |
| 4,683,431 A | * | 7/1987 | Pattany et al. | 324/306 |
| 4,710,717 A | * | 12/1987 | Pelc et al. | 324/309 |
| 4,896,112 A | | 1/1990 | Ratzel et al. | |
| 4,965,520 A | | 10/1990 | Sakamoto | |
| 5,111,819 A | * | 5/1992 | Hurd | 600/410 |
| 5,353,794 A | * | 10/1994 | Miyazaki | 600/410 |
| 5,499,629 A | * | 3/1996 | Kerr et al. | 600/410 |
| 5,530,352 A | * | 6/1996 | Kolem | 600/410 |
| 5,749,834 A | * | 5/1998 | Hushek | 600/410 |
| 6,031,375 A | * | 2/2000 | Atalar et al. | 324/307 |
| 6,091,242 A | * | 7/2000 | Hanawa | 324/307 |
| 6,272,369 B1 | * | 8/2001 | Tan | 600/410 |
| 6,285,900 B1 | * | 9/2001 | Stuber et al. | 600/410 |
| 6,549,799 B2 | * | 4/2003 | Bock et al. | 600/422 |
| 6,560,477 B1 | * | 5/2003 | Filler | 600/410 |

FOREIGN PATENT DOCUMENTS

| EP | 0 495 404 | 7/1992 |
| EP | 0 507 288 | 10/1992 |
| WO | WO 89/10553 | 11/1989 |

OTHER PUBLICATIONS

Modified Carr–Purcell–Meilboom–Gill Sequenze for NMR Fourier Imaging Applications, Maudsley, J. of Mag. Res. vol. 69 (1986) pp. 468–491.

"Improved Proton Spectroscopic U–FLARE Imaging for the Detection of Coupled Resonances in the Rat Brain in Vivo," Dreher et al., Magnetic Resonance Imaging, vol. 17, No. 4 (1999) pp. 611–621.

"Image Reconstruction for Echo Planar Imaging with Non-equidistant k–Space Sampling," Bruder et al., Magnetic Resonance in Medicine, vol. 23 (1992) pp. 311–323.

* cited by examiner

Primary Examiner—Daniel Robinson
(74) Attorney, Agent, or Firm—Schiff Hardin & Waite

(57) ABSTRACT

In a spectroscopic imaging method for a magnetic resonance apparatus, an excitation radio-frequency pulse having a flip angle of approximately 90° is emitted, followed by transmission of a rephasing radio-frequency pulse having a flip angle of 180°, activation of a phase-coding gradient, and activation of a readout gradient and acquisition of a magnetic resonance signal. The following steps are then executed at least three times. A rephasing radio-frequency pulse having a flip angle of 180° and having a 90° phase offset in relation to a chronologically immediately preceding rephasing radio-frequency pulse is emitted, and the readout gradient is activated and a magnetic resonance signal is acquired.

41 Claims, 2 Drawing Sheets

SPECTROSCOPIC IMAGING METHOD

BACKGROUND OF THE INVENTION

1. Field of the Invention

The present invention is directed to a spectroscopic imaging method.

2. Description of the Prior Art

For more than four decades, magnetic resonance spectroscopy has been used in fundamental research in physics, chemistry, and biochemistry, for example as a technique of analysis or for the structural clarification of complex molecules. Clinical magnetic resonance spectroscopy refers to magnetic resonance spectroscopy using clinical magnetic resonance tomography apparatuses. The methods of localized magnetic resonance spectroscopy are distinguished from those of magnetic resonance imaging essentially only in that in spectroscopy chemical displacement is also resolved, in addition to tomographic spatial resolution. In tomographic imaging, for example multi-spin echo methods, such as the RARE (Rapid Acquisition with Relaxation Enhancement) method are known, in which, in contrast to a single spin echo pulse sequence, additional spin echoes are produced by adding additional 180° radio-frequency pulses. For multi-spin echo methods in tomographic imaging, improvements are known that seek to achieve a high signal level for a largest possible number of additional spin echoes. Here, reference is made to, among other sources. For example, A. A. Maudsley, "Modified Carr-Purcell-Meiboom-Gill Sequence for NMR Fourier Imaging Application," Journal of Magnetic Resonance 69, 1986, pp.488–491, discloses producing a 90° phase offset from pulse to pulse for radio-frequency pulses following one another immediately in time.

Currently, in clinical applications two localization methods are dominant for magnetic resonance spectroscopy. One type includes individual volume techniques based on echo methods, in which a spectrum of a target volume selected beforehand on the basis of proton images is recorded. Another type are spectroscopic imaging methods, known as CSI methods (Chemical Shift Imaging), that simultaneously enable the recording of spectra of a multiplicity of spatially contiguous target volumes.

The single-volume techniques standardly used today are based on an acquisition of a stimulated echo or of a secondary spin echo. In both cases, a spatial resolution takes place by successive selective excitation of three orthogonal layers. The target volume is defined by the slice volume of these three layers. Only the magnetization of the target volume experiences all three selective radio-frequency pulses and thus contributes to the stimulated and secondary spin echo. The spectrum of the target volume is obtained by one-dimensional Fourier transformation of a time signal corresponding to the stimulated echo or to the secondary spin echo.

Spectroscopic imaging methods are used both in clinical phosphorus spectroscopy as well as in proton spectroscopy. A 3D CSI pulse sequence has, for example, the following steps: After a non-layer-selective 90° radio-frequency pulse, a combination of magnetic phase-coding gradients of the three spatial directions is activated for a defined time duration, and subsequently the magnetic resonance signal is read out in the absence of all gradients. This procedure is repeated as often as necessary with different combinations of phase-coding-coding gradients until the desired spatial resolution has been achieved. A four-dimensional Fourier transformation of the magnetic resonance signals supplies the desired spatial distribution of the resonance lines. If the above-described non-selective radio-frequency pulse is replaced by a layer-selective excitation, consisting of a frequency-selective radio-frequency pulse and a corresponding magnetic gradient, one phase-coding direction can be omitted, and in a 2D CSI pulse sequence of this sort the measurement time is reduced in relation to the 3D CSI pulse sequence.

In clinical proton spectroscopy, the intensive water signals are often suppressed by means of water suppression techniques. One such technique for water suppression is, for example, the CHESS technique, in which the nuclear spins of the water molecules are first selectively excited by narrowband 90° radio-frequency pulses, and their cross-magnetization is subsequently dephased through the switching of magnetic field gradients. For an immediately subsequent spectroscopic imaging method, in the ideal case no detectable magnetization of the water molecules is therefore available. In methods using a suppression of a dominant resonance line, however, lines adjacent to the dominant resonance line are also at least partially saturated as well, so that, disadvantageously, these lines appear only weakly, or not at all, in the associated spectrum.

In general, fast CSI methods are based on multiecho sequences. Besides the one desired echo per readout interval, secondary echoes and stimulated echoes also occur in multiecho sequences. In connection with the large offset frequencies due to the chemical displacement, this leads to the formation of two echo groups, known as an even echo family and an odd echo family.

One of the fast CSI methods is known as the CSI-U-FLARE method. Here a distinction is made between variants known as coherent, phase-cyclical, and pushing-apart. In the coherent CSI-U-FLARE method, for the suppression of the above-cited formation of two echo groups an attempt is made, inside an acquisition window, to superimpose the even and the odd echoes in phase-coherent fashion by carrying out a fine adjustment of gradients and sequence parameters. Because the above-cited superimposition succeeds only for a single resonance line, and because slight de-adjustments already cause significant artefacts, the coherent CSI-U-FLARE method has not achieved significance in spectroscopic imaging.

In the phase-cyclical CSI-U-FLARE method, two complete measurements are carried out that are distinguished from one another only in that the refocusing radio-frequency pulses have respective phase angles that are offset by, for example, 90°. By means of a corresponding subsequent processing of the two measurement results, an unambiguous identification of the two echo families can be achieved. The measurement results are thereby separated in the time domain, and for the two echo families the corresponding spectra are reconstructed and the two spectra are added, with a mirroring of the spectrum for one of the echo families being necessary before the addition. The necessary mirroring of the spectra has, for example, the result that, given an incomplete separation of the measurement results, artefacts arise in the two spectra. In relation to the theoretically ideal coherent method, in the phase-cyclical method the overall measurement time is doubled due to the two measurements, and the signal-noise ratio for a comparable measurement time is reduced to approximately 71%.

In the pushing-apart variant of the CSI-U-FLARE method, the two echo families are purposely pushed apart in such a way that either only one of the echo families is detected in an acquisition window, or both are sufficiently distant from one another that they can be acquired individually. For this purpose, gradient time surfaces are intentionally misadjusted. In relation to the theoretically ideal coherent method, the signal-to-noise ratio for a comparable measurement time is thereby reduced to 50 percent. Further explanation of the CSI-U-FLARE method can be found in the article by W. Dreher et al., "Improved Proton Spectroscopic U-FLARE Imaging for the Detection of Coupled Resonances in the Rat Brain in Vivo," Magnetic Resonance Imaging, volume 17, no. 4, 1999, pp. 611–621.

A general disadvantage of the CSI-U-FLARE methods is that an excited transversal magnetization during the measurement time is partially converted into a longitudinal magnetization, and thus is not available for signal acquisition. A further disadvantage of the above-cited methods is that the amplitudes of the various echo families during the first echo first must be stabilized in order to ensure a uniform distribution of both echo families and a subsequent signal curve that decreases monotonically. Due to this, the first echo cannot be used, or can be used only in limited fashion.

SUMMARY OF THE INVENTION

An object of the present invention is to provide a rapid spectroscopic imaging method that has a high signal-to-noise ratio and that reduces the above-cited disadvantages of the known rapid CSI methods.

This object is achieved according to the invention in a spectroscopic imaging method for a magnetic resonance apparatus, containing the following method steps:

(a) Transmission of an excitation radio-frequency pulse having a flip angle of approximately 90°, (b) Execution of the following method steps:
Transmission of a rephasing radio-frequency pulse having a flip angle of 180°.
Activating a phase-coding gradient.
Activating a readout gradient and acquisition of a magnetic resonance signal.

(c) Execution at least three times of the following method steps:
Transmission of a rephasing radio-frequency pulse having a flip angle of 180° and having a 90° phase offset in relation to a chronologically immediately preceding rephasing radio-frequency pulse.
Activating the readout gradient and acquisition of a magnetic resonance signal.

By the use of the 90° phase offset from one 180° rephasing radio-frequency pulse to the next, effects that lead to a loss of signal level of the magnetic resonance signals, caused by phase differences within an excited nuclear spin group due to the frequency differences that occur and that are to be acquired during the spectroscopy, as well as due to deviations of the flip angle from 180°, are compensated to such an extent that, despite the frequency differences, a formation of two echo families is prevented. In contrast to the coherent CSI-U-FLARE method, in which a phase-coherent superposition of even and odd echo families can be carried out only for one resonance line, here the superposition can successfully be carried out for a number of resonance lines. In addition, in contrast to the CSI-U-FLARE methods the magnetization is kept almost constantly transversal, and thus is fully available for the acquisition of magnetic resonance signals. In addition, in contrast to the CSI-U-FLARE methods a stabilization during the first echo is not required, so that all acquired magnetic resonance signals can be used for the formation of magnetic resonance spectra. The above differences result in a higher signal-noise ratio in comparison with the known fast CSI methods.

In addition, an improved signal-noise ratio can be achieved in comparison with the classical CSI methods, in which magnetic resonance signals are read out in the absence of gradients and the spatial coding takes place exclusively by means of phase-coding gradients. The reason for this is that in the inventive method a long acquisition time, on the order of magnitude of the $T_2$ time, is available, whereas in the classical CSI method only an acquisition time on the order of magnitude of the $T_2^*$ time can be used. Thus, in the inventive method an improved signal-noise ratio is achieved despite a decay of the magnetic resonance signal as a consequence of the $T_2$ time, due to accumulation effects resulting from the long acquisition times. This is true in particular for apparatuses having a high magnetic flux density of the basic magnetic field, in which the $T_2^*$ time is often very much smaller than the associated $T_2$ time.

A further embodiment of the inventive spectroscopic imaging method contains the following additional method steps:

($d_1$) Multiple repetition of steps (b) and (c), with a variation of the phase-coding gradient per repetition, and ($e_1$) Multiple repetition of steps (a) to ($d_1$), with a variation of at least one chronological spacing between steps (a) and (b) from one another per repetition.

The magnetic resonance signals that correspond to one another with respect to a chronological sequence within steps (b) and (c) in the repeated execution are stored in respective data sets, and the data sets are reconstructed individually for the formation of magnetic resonance spectra, for example by means of a Fourier transformation, and the reconstructed data sets are added.

Another embodiment of the inventive spectroscopic imaging method contains the following additional method steps:

($d_2$) Multiple repetition of step (b) with a variation of the phase-coding gradient and with a transmission of the rephasing radio-frequency pulse with a 90° phase offset in relation to a chronologically immediately preceding rephasing radio-frequency pulse per repetition, and ($e_2$) Multiple repetition of steps (a) to ($d_2$), with a variation of at least one chronological spacing between steps (a) and (b) from one another per repetition.

In another embodiment, the spectroscopic imaging method contains the following additional method steps:

(d₃) Execution of steps (a) and 9b) with a multiple repetition of step (b) with a variation of the phase-coding gradient and with a transmission of the rephasing radio-frequency pulse with a 90° phase offset in relation to a chronologically immediately preceding rephasing radio-frequency pulse per repetition.

e₃) Multiple repetition of step (d₃) with a variation of at least one chronological spacing between steps (a) and (b) from one another per repetition.

In the latter two embodiments for additional method steps, in relation to the first further embodiment, a shortening of the measurement time can be achieved, or in the same measurement time a larger data matrix can be recorded. For the latter two embodiments for additional method steps, a phase correction is taken into account for this purpose.

In another embodiment, from the at least four magnetic resonance signals acquired with an unmodified phase-coding gradient, correction data are determined for a phase correction, with which magnetic resonance signals that are acquired with a varied phase-coding gradient from rephasing radio-frequency pulse-to-rephasing radio-frequency pulse can be correspondingly phase-corrected. For the description of the principles of a known method for phase correction, reference is made, for example, to the article by H. Bruder et al., "Image Reconstruction for Echo Planar Imaging with Nonequidistant k-Space Sampling," Magnetic Resonance in Medicine 23, 1992, pp. 311–323.

In another embodiment, the spectroscopic imaging method contains the following additional method step between steps (a) and (b):

(ab) Transmission of an initial rephasing radio-frequency pulse having a flip angle of 180°.

If this step (ab) is executed, then varying the chronological spacing between steps (a) and (b) in the aforementioned embodiments includes varying at least one of the chronological spacing between steps (a) and (ab) and between steps (ab) and (b).

In this way, in particular in connection with the variation of the chronological spacing of steps (ab) and (b) for the coding of the chemical displacement by displacing the initial rephasing radio-frequency pulse within a time interval that remains constant and that is adjoined by the excitation radio-frequency pulse and by step (b), magnetic resonance spectra with effective homonuclear decoupling can be recorded.

DESCRIPTION OF THE PREFERRED EMBODIMENTS

Figure 1:
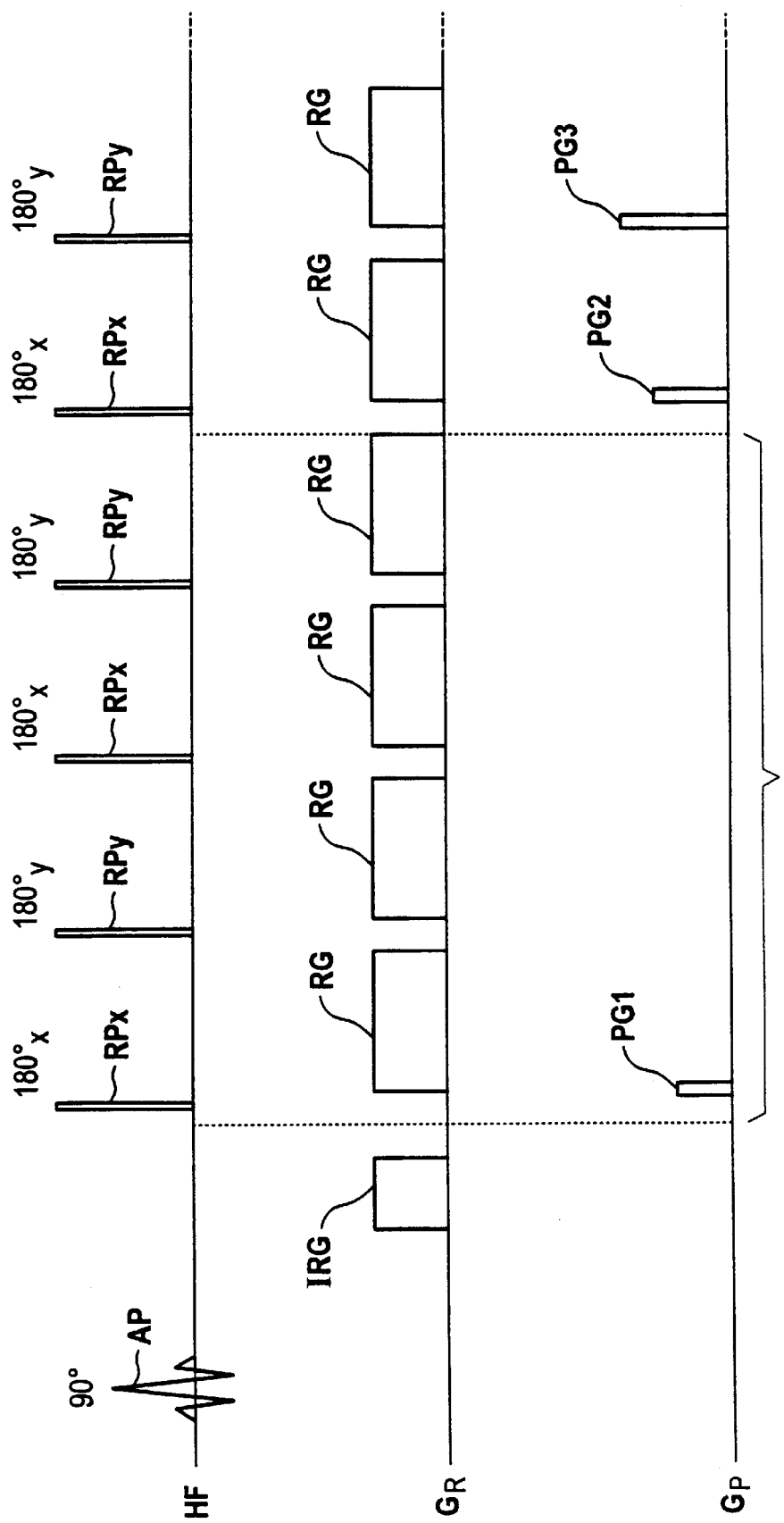
FIG. 1 shows a first pulse and gradient sequence of a spectroscopic imaging method in accordance with the invention.

FIG. 1 shows, as an exemplary embodiment of the invention, a first pulse and gradient sequence of a spectroscopic imaging method. Radio-frequency pulses that follow in a chronological sequence are emitted and the following gradients are activated: First, a 90° excitation radio-frequency pulse AP is transmitted. In a readout direction $G_R$, an initial readout gradient IRG is activated having gradient time area (integral) is equal to one half of a gradient time area of one of the subsequent readout gradients RG. Following the initial readout gradient IRG, a first 180° rephasing radio-frequency pulse RPx is emitted. Subsequently, a first phase-coding gradient PG1 is activated in a phase-coding direction $G_p$, and a readout gradient RG is activated in readout direction $G_R$. Following the first phase-coding gradient PG1, a magnetic resonance signal is acquired during a time duration of the readout gradient RG. Subsequently, an additional 180° rephasing radio-frequency pulse RPy is emitted that has a 90° phase offset in relation to the chronologically immediately preceding 180° rephasing radio-frequency pulse RPx, which is identified in the reference symbols by a change from x to y. Following the radio-frequency pulse RPy, a readout gradient RG is activated, during which a magnetic resonance signal is again acquired. Subsequently, a 180° rephasing radio-frequency pulse RPx is again emitted, a readout gradient RG is activated, during which a magnetic resonance signal is acquired, an additional 180° rephasing radio-frequency pulse RPy is emitted, and an additional readout gradient RG is activated, during which an additional magnetic resonance signal is acquired. Subsequently, an additional 180° rephasing radio-frequency pulse RPx is emitted, followed by a phase-coding gradient PG2 that is incremented in relation to the phase-coding gradient PG1; at the same time, a readout gradient RG is activated, during which a magnetic resonance signal is acquired. The latter is repeated with a phase-coding gradient PG3 that is incremented in relation to the phase-coding gradient PG2, and so on. The 180° rephasing radio-frequency pulses each have a 90° phase offset to the chronologically immediately preceding 180° rephasing radio-frequency pulse.

From the magnetic resonance signals that are acquired during a cycle Z1 with the unmodified phase-coding gradient PG1, correction data for a phase correction are determined. As noted above, a suitable known method of phase correction is described by H. Bruder et al., "Image Reconstruction for Echo Planar Imaging with Nonequidistant k-Space Sampling," Magnetic Resonance in Medicine 23, 1992, pp. 311–323. With the correction data, subsequently acquired magnetic resonance signals that are recorded with a varied phase-coding gradient PG2, PG3, etc., from 180° rephasing radio-frequency pulse to 180° rephasing radio-frequency pulse, are correspondingly phase-corrected. It is particularly advantageous to acquire at least those magnetic resonance signals that are used for the formation of correction data in a manner without suppression of a dominant resonance line, so that the magnetic resonance signals are recorded with correspondingly high signal amplitudes. Forth is purpose, it is additionally advantageous to set the first phase-coding gradient PG1 equal to zero.

The acquisition of magnetic resonance signals with the phase-coding gradient varied from 180° rephasing radio-frequency pulse-to-180° rephasing radio-frequency pulse is continued as long as the $T_2$ time enables recording of magnetic resonance signals with a reasonable signal-to-noise ratio. An overall acquisition time, following the 90° excitation radio-frequency pulse, on the order of magnitude of the $T_2$ time thereby makes sense. Subsequently, the pulse and gradient sequence of FIG. 1 is repeated, with the chronological spacing between the 90° excitation radio-frequency pulse AP and the first 180° rephasing radio-frequency pulse RPx being varied for the coding of the chemical displacement. For a complete coding of the chemical displacement, 96 repetitions, for example, of the pulse and gradient sequence of FIG. 1 are required.

For clarity, in the pulse and gradient sequence of FIG. 1 a representation of a spatial resolution in a third spatial direction has been omitted. The spatial resolution in the third spatial direction can, for example, be achieved by a slice selection or by an additional phase-coding gradient.

In another embodiment, in the repetitions of the pulse and gradient sequence according to FIG. 1 the cycle Z1 is skipped and the method continues immediately with a phase-coding varied from 180° rephasing radio-frequency pulse-to-180° rephasing radio-frequency pulse. For the phase correction of the magnetic resonance signals thereby recorded, the correction data of the first cycle Z1 after the first 90° excitation radio-frequency pulse AP are thereby used. It is advantageous to carry out a larger number of repetitions within the cycle Z1 than the threefold repetition shown in FIG. 1, and to set the phase-coding gradient PG1 equal to zero.

Figure 2:
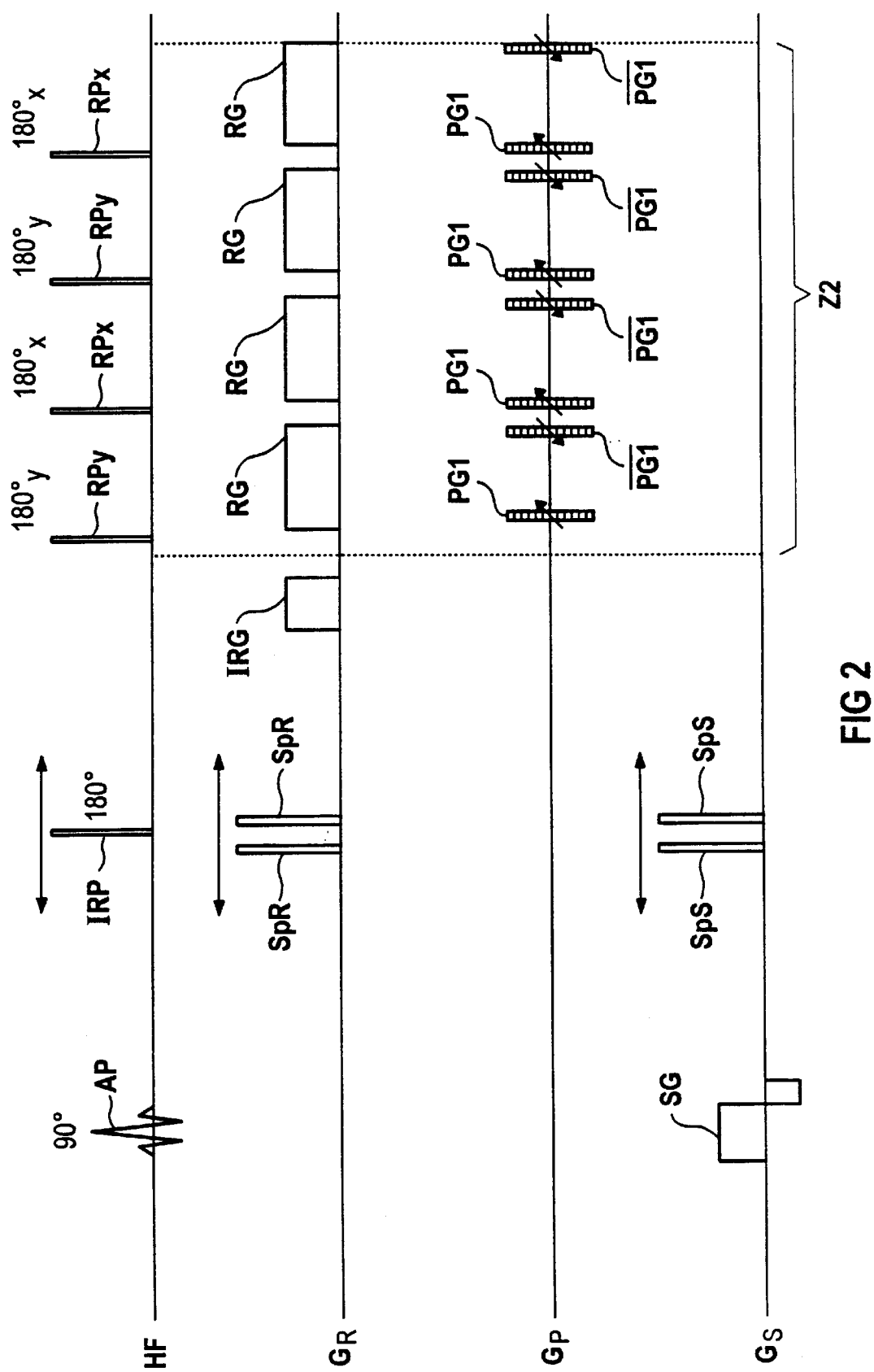
FIG. 2 shows a second pulse and gradient sequence of a spectroscopic imaging method in accordance with the invention.

FIG. 2 shows, as a further exemplary embodiment of the invention, a second pulse and gradient sequence of a spectroscopic imaging method. The pulse and gradient sequence of FIG. 2 has the following differences in relation to FIG. 1. By the simultaneous switching of a layer selection gradient SG in a slice selection direction $G_S$, the 90° excitation radio-frequency pulse AP acts in a slice-selective manner. Between the excitation radio-frequency pulse AP and the first 180° rephasing radio-frequency pulse RPy, an initial rephasing radio-frequency pulse IRP is supplemented with a flip angle of 180°. In this way, given a time interval that remains constant between the excitation radio-frequency pulse AP and the first rephasing radio-frequency pulse RPy, and given a displacement of the initial re-phasing radio-frequency pulse IRP within the time interval per repetition of the pulse and gradient sequence, magnetic resonance spectra can be recorded with effective homonuclear decoupling. In addition, the initial 180° rephasing radio-frequency pulse IRP in the readout direction $G_R$ and slice selection direction $G_S$ is surrounded by spoiler gradients SpR and SpS. In a variation, in a corresponding manner additional spoiler gradients are activated for the rephasing radio-frequency pulses RPy and RPx. The cycle Z2 of FIG. 2 differs from the cycle Z1 of FIG. 1 in that a phase-coding gradient PG1 is activated per readout gradient RG at the beginning of a time span of the readout gradient RG, and at the end of the time span an additional phase-coding gradient $\overline{PG1}$ is activated, whereby the additional phase-coding gradient $\overline{PG1}$ is equal to the preceding phase-coding gradient PG1 so as to counteract it.

The cycle Z2 is repeated as long as, as a result of the $T_2$ signal decay, an acquisition of magnetic resonance signals is possible with a reasonable signal-to-noise ratio. The phase-coding gradient is thereby correspondingly incremented from repetition to repetition of the cycle Z2. On the basis of the repetitions of the complete cycle Z2, in relation to FIG. 1 a phase correction of magnetic resonance signals can be omitted. For the coding of the chemical displacement, the pulse and gradient schema of FIG. 2 is repeated correspondingly often, whereby from repetition-to-repetition the initial 180° rephasing radio-frequency pulse IRP, including the spoiler gradients SpR and SpS, is displaced between the 90° excitation radio-frequency pulse AP and the first 180° rephasing radio-frequency pulse RPy. The magnetic resonance signals that are recorded within the cycle Z2 at the same chronological point are stored in respective data sets. For the formation of magnetic resonance spectra, these data sets are individually reconstructed and are subsequently added.

In another embodiment, instead of the slice selection gradient SG in the slice selection direction $G_S$, an additional phase-coding gradient is activated once after each 90° excitation radio-frequency pulse AP, so that a corresponding three-dimensional al coding is achieved. In addition, a corresponding method step can be executed e the 90° excitation radio-frequency pulse AP for the suppression of a dominant resonance line.

Although modifications and changes may be suggested by those skilled in the is the intention of the inventors to embody within the patent warranted hereon all changes and modifications as reasonably and properly come within the scope of their contribution to the art.

We claim as our invention:

1. A spectroscopic imaging method for a magnetic resonance apparatus, comprising the steps of:
    (a) emitting an excitation radio-frequency pulse having a flip angle of approximately 90°;
    (b) emitting a rephasing radio-frequency pulse having a flip angle of 180°, and activating a phase-coding gradient, and activating a readout gradient and acquiring a magnetic resonance signal; and
    (c) at least three times, emitting a rephasing radio-frequency pulse having a flip angle of 180° and a 90° phase offset relative to a chronologically immediately preceding rephasing radio-frequency pulse, activating said readout gradient and acquiring a magnetic resonance signal.

2. A spectroscopic imaging method as claimed in claim 1 comprising the additional steps of:
    ($d_1$) multiply repeating steps (b) and (c) and varying the phase-coding gradient per repetition; and
    ($e_1$) multiply repeating steps (a) through ($d_1$) and varying a chronological spacing between steps (a) and (b) per repetition.

3. A spectroscopic imaging method as claimed in claim 2 comprising storing magnetic resonance signals in respective data sets that correspond to each other with respect to a chronological sequence within steps (b) and (c).

4. A spectroscopic imaging method as claimed in claim 3 comprising individually reconstructing the respective data sets for forming magnetic resonance spectra.

5. A spectroscopic imaging method as claimed in claim 4 comprising reconstructing the respective data steps using a Fourier transformation.

6. A spectroscopic imaging method as claimed in claim 4 comprising adding the reconstructed data sets.

7. A spectroscopic imaging method as claimed in claim 1 comprising the additional steps of:
    ($d_2$) multiply repeating step (b) and varying the phase-coding gradient and emitting the rephasing radio-frequency pulse with a 90° phase offset relative to a chronologically immediately preceding rephasing radio-frequency pulse per repetition; and (e₂) multiply repeating steps (a) through (d₂) and varying a chronological spacing between steps (a) and (b) per repetition.

8. A spectroscopic imaging method as claimed in claim 7 comprising determining correction data for a phase correction from at least four of said magnetic resonance signals with said phase-coding gradient unmodified.

9. A spectroscopic imaging method as claimed in claim 8 comprising using said correction data to phase correct respective magnetic resonance signals acquired from rephasing radio-frequency pulse-to-rephasing radio-frequency pulse with the phase-coding gradient being varied.

10. A spectroscopic imaging method as claimed in claim 7 comprising at least four of said magnetic resonance signals with said phase-coding gradient unmodified without suppression of a dominant resonance line.

11. A spectroscopic imaging method as claimed in claim 1 comprising the additional steps of:

(d₃) executing steps (a) and (b) with multiple repetitions of step (b) and varying the phase-coding gradient and emitting the rephasing radio-frequency pulse with a 90 phase offset relative to a chronologically immediately preceding rephasing radio-frequency pulse per repetition; and (e₃) multiply repeating step (d₃) and varying a chronological spacing between steps (a) and (b) per repetition.

12. A spectroscopic imaging method as claimed in claim 11 comprising determining correction data for a phase correction from at least four of said magnetic resonance signals with said phase-coding gradient unmodified.

13. A spectroscopic imaging method as claimed in claim 12 comprising using said correction data to phase correct respective magnetic resonance signals acquired from rephasing radio-frequency pulse-to-rephasing radio-frequency pulse with the phase-coding gradient being varied.

14. A spectroscopic imaging method as claimed in claim 11 comprising at least four of said magnetic resonance signals with said phase-coding gradient unmodified without suppression of a dominant resonance line.

15. A spectroscopic imaging method as claimed in claim 1 comprising the additional steps of:

(d₁) multiply repeating steps (b) and (c) and varying the phase-coding gradient per repetition; and (e₁) multiply repeating steps (a) through (d₁) and varying a chronological spacing between steps (a) and (b) per repetition by chronologically displacing step (b) relative to emission of said excitation radio-frequency pulse.

16. A spectroscopic imaging method as claimed in claim 1, comprising the additional step between steps (a) and (b) of:

(ab) emitting an initial rephasing radio-frequency pulse having a flip angle of 180°.

17. A spectroscopic imaging method as claimed in claim 16 comprising the additional steps of:

(d₁) multiply repeating steps (b) and (c) and varying the phase-coding gradient per repetition; and (e₁) multiply repeating steps (a), (ab) and (b) and varying at least one chronological spacing between steps (a) and (ab) and between step (ab) and (b) per repetition.

18. A spectroscopic imaging method as claimed in claim 17 comprising storing magnetic resonance signals in respective data sets that correspond to each other with respect to a chronological sequence within steps (b) and (c).

19. A spectroscopic imaging method as claimed in claim 18 comprising individually reconstructing the respective data sets for forming magnetic resonance spectra.

20. A spectroscopic imaging method as claimed in claim 19 comprising reconstructing the respective data steps using a Fourier transformation.

21. A spectroscopic imaging method as claimed in claim 19 comprising adding the reconstructed data sets.

22. A spectroscopic imaging method as claimed in claim 1 comprising the additional steps of:

(d₂) multiply repeating step (b) and varying the phase-coding gradient and emitting the rephasing radio-frequency pulse with a 90° phase offset relative to a chronologically immediately preceding rephasing radio-frequency pulse per repetition; and (e₂) multiply repeating steps (a) through (d₂), including step (ab), and varying at least one chronological spacing between steps (a) and (ab) and between (ab) and (b) per repetition.

23. A spectroscopic imaging method as claimed in claim 22 comprising determining correction data for a phase correction from at least four of said magnetic resonance signals with said phase-coding gradient unmodified.

24. A spectroscopic imaging method as claimed in claim 23 comprising using said correction data to phase correct respective magnetic resonance signals acquired from rephasing radio-frequency pulse-to-rephasing radio-frequency pulse with the phase-coding gradient being varied.

25. A spectroscopic imaging method as claimed in claim 22 comprising at least four of said magnetic resonance signals with said phase-coding gradient unmodified without suppression of a dominant resonance line.

26. A spectroscopic imaging method as claimed in claim 1 comprising the additional steps of:

(d₃) executing steps (a) and (b) with multiple repetitions of step (b) and varying the phase-coding gradient and emitting the rephasing radio-frequency pulse with a 90 phase offset relative to a chronologically immediately preceding rephasing radio-frequency pulse per repetition; and (e₃) multiply repeating step (d₃) and varying at least one chronological spacing between steps (a) and (ab) and between (ab) and (b) per repetition.

27. A spectroscopic imaging method as claimed in claim 26 comprising determining correction data for a phase correction from at least four of said magnetic resonance signals with said phase-coding gradient unmodified.

28. A spectroscopic imaging method as claimed in claim 27 comprising using said correction data to phase correct respective magnetic resonance signals acquired from rephasing radio-frequency pulse-to-rephasing radio-frequency pulse with the phase-coding gradient being varied.

29. A spectroscopic imaging method as claimed in claim 26 comprising at least four of said magnetic resonance signals with said phase-coding gradient unmodified without suppression of a dominant resonance line.

30. A spectroscopic imaging method as claimed in claim 17 comprising varying said chronological spacing in step ($e_1$) by chronologically displacing said initial rephasing radio-frequency pulse between the excitation radio-frequency pulse and step (b).

31. A spectroscopic imaging method as claimed in claim 1 wherein step (b) further comprises activating an additional phase-coding gradient equal to a preceding phase-coding gradient to counteract said preceding phase-coding gradient, and wherein step (c) comprises activating the phase-coding gradient before acquiring said magnetic resonance signal and activating an additional phase-coding gradient after acquiring said magnetic resonance signal.

32. A spectroscopic imaging method as claimed in claim 31 comprising, in steps (b) and (c), activating said readout gradient for a time span and activating said phase-coding gradient in a time region at a beginning of said time span, and activating an additional phase-coding gradient in an additional time region at an end of said time span, and acquiring said magnetic resonance signal between said time regions.

33. A spectroscopic imaging method as claimed in claim 1 comprising, after emitting the excitation radio-frequency pulse and before step (b), activating an initial readout gradient comprising a gradient time area equal to one-half of a gradient time area of said readout gradient.

34. A spectroscopic imaging method as claimed in claim 1 comprising the additional steps of:

between steps (a) and (b), emitting an initial rephasing radio-frequency pulse having a flip angle of 180°; and respectively before and after said initial rephasing radio-frequency pulse, activating spoiler gradients.

35. A spectroscopic imaging method as claimed in claim 1 comprising, respectively before and after said rephasing radio-frequency pulse, activating spoiler gradients.

36. A spectroscopic imaging method as claimed in claim 1 comprising the additional step of determining correction data from at least two magnetic resonance signals acquired chronologically subsequent to said excitation radio-frequency pulse.

37. A spectroscopic imaging method as claimed in claim 36 comprising amplitude correcting said magnetic resonance signals using said correction data.

38. A spectroscopic imaging method as claimed in claim 1 comprising setting said phase-coding gradient in step (b) equal to 0.

39. A spectroscopic imaging method as claimed in claim 1 comprising activating an additional phase-coding gradient in a direction other than a direction of said phase-coding gradient and other than a direction of said readout gradient.

40. A spectroscopic imaging method as claimed in claim 39 comprising activating said additional phase-coding gradient after step (a) and before (b).

41. A spectroscopic imaging method as claimed in claim 1 comprising activating at least one slice selection gradient between steps (a) and (b).

* * * * *